United States Patent [19]

Suda et al.

[11] Patent Number: 4,755,859
[45] Date of Patent: Jul. 5, 1988

[54] THIN FILM STATIC INDUCTION TRANSISTOR AND METHOD FOR MANUFACTURING THE SAME

[75] Inventors: Yoshiyuki Suda, Yokohama; Satoshi Takayama, Kawasaki, both of Japan

[73] Assignee: Kabushiki Kaisha Toshiba, Kawasaki, Japan

[21] Appl. No.: 911,440

[22] Filed: Sep. 25, 1986

[30] Foreign Application Priority Data

Sep. 30, 1985 [JP] Japan .................. 60-216564
Aug. 20, 1986 [JP] Japan .................. 61-194574

[51] Int. Cl.⁴ .................. H01L 29/78; H01L 29/80; H01L 29/34; H01L 29/06
[52] U.S. Cl. .................. 357/23.4; 357/2; 357/15; 357/20; 357/22; 357/23.1; 357/23.15; 357/54; 357/55; 357/56; 357/88; 357/89; 357/90
[58] Field of Search .................. 357/23.1, 22 E, 22 D, 357/22 J, 22 K, 23-24, 2, 15, 23.15, 54, 55, 56, 89, 90, 20, 88

[56] References Cited

U.S. PATENT DOCUMENTS

| | | |
|---|---|---|
| 2,930,950 | 3/1960 | Teszner .................. 357/22 E |
| 3,363,153 | 1/1968 | Zloczower .................. 357/22 E |
| 4,262,296 | 4/1981 | Sheahy et al. .................. 357/22 E |
| 4,449,285 | 5/1984 | James et al. .................. 357/23.4 |
| 4,514,747 | 4/1985 | Miyata et al. .................. 357/20 |
| 4,528,745 | 7/1985 | Muraoka et al. .................. 357/22 E |
| 4,567,641 | 2/1986 | Balige et al. .................. 357/22 E |
| 4,568,958 | 2/1986 | Baliga .................. 357/22 E |
| 4,611,384 | 9/1986 | Bencuyer et al. .................. 357/22 E |

FOREIGN PATENT DOCUMENTS

| | | |
|---|---|---|
| 55-85069 | 6/1980 | Japan .................. 357/22 E |
| 60-784 | 1/1985 | Japan . |
| 60-224280 | 11/1985 | Japan . |

OTHER PUBLICATIONS

J.J.A.P. vol. 24, No. 4 (1985), pp. 467-471; "Amorphous Silicon Static Induction Transistor"; M. Ueda et al.

Primary Examiner—James J. Carroll
Assistant Examiner—Ngân Ngô
Attorney, Agent, or Firm—Oblon, Fisher, Spivak, McClelland & Maier

[57] ABSTRACT

A thin film static induction transistor comprises a first n type semiconductor layer provided on an insulative substrate and a second n type semiconductor layer mounted on the first layer. The second layer includes a first region having a first level top wall and a second region having a second level top wall lower that the first level top wall. The first and second regions are alternately arranged. A third semiconductor layer is provided on the first level top wall. A recess is formed which includes side walls of the third layers, side wall of the first regions and the second level top wall. A fourth semiconductor layer is deposited on the inner wall of the recess, and a gate electrode is provided on the fourth layer. The fourth layer consists of an intrinsic semiconductor layer or a semiconductor layer having a lower impurity concentration than the second layer.

9 Claims, 6 Drawing Sheets

F I G. 4
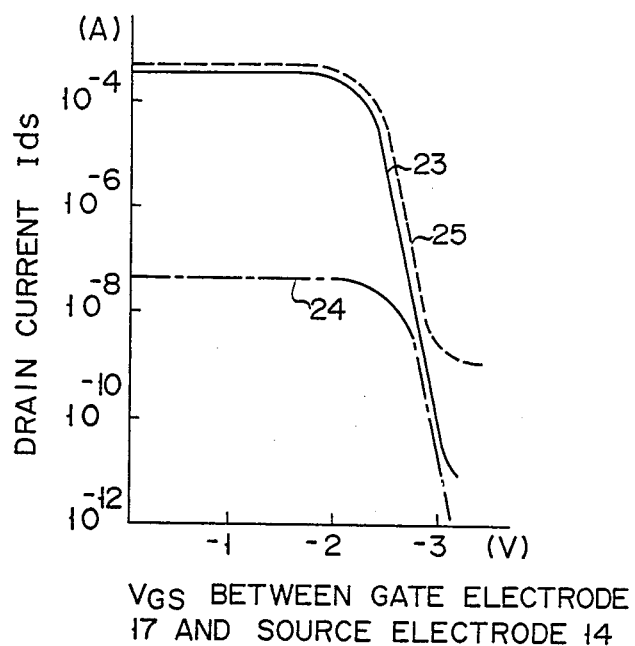
V_GS BETWEEN GATE ELECTRODE
17 AND SOURCE ELECTRODE 14
F I G. 5
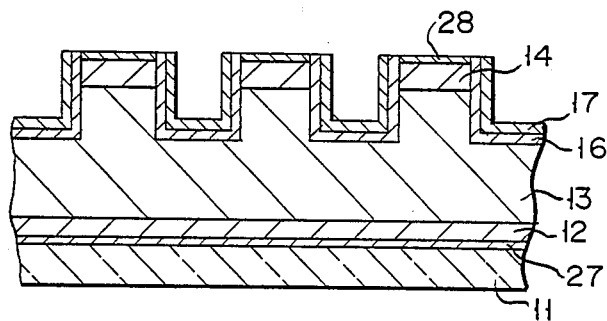

THIN FILM STATIC INDUCTION TRANSISTOR AND METHOD FOR MANUFACTURING THE SAME

BACKGROUND OF THE INVENTION

This invention relates to a thin film static induction transistor and a method for manufacturing the same.

In recent years, active research work is performed on the method of fabricating numerous active devices within a thin spacious semiconductor film. These devices are applied, for example, as image sensors of an image input device, or thin film transistors for driving a display panel in a liquid crystal television system. Since the above-mentioned active devices are demanded to carry out a high speed operation, the method of manufacturing high speed TFTs (thin film transistors) is now raised as a problem. For the resolution of the problem, various types of MOS TFT have been developed by introducing CVD (chemical vapor deposition) or sputtering. For example, an MOS TFT prepared from amorphous semiconductor such as amorphous silicon or another type of MOS TFT consisting of polycrystalline silicon has been developed. However, the MOS type TFT prepared from the above-mentioned amorphous silicon has an operation frequency of the order of 200 KHz, and the MOS type TFT consisting of the aforesaid polycrystalline silicon has an operation frequency of 1 to 2 MHz. In recent years, active devices formed within a thin semiconductor film are demanded to be operated with a frequency of 5 to 10 MHz. Moreover, it is desired to manufacture active devices like MOS type TFTs by a low temperature process. From the above-mentioned point of view, the MOS type TFT prepared from amorphous silicon has the drawback that the operation frequency is small, though it is adapted for the low temperature manufacture. Another MOS type TFT prepared from polycrystalline silicon has the drawbacks that since it has to be fabricated at a high temperature such as at least 500° C., it is not only unsuitable for the low temperature manufacture but also fails to have its operation frequency increased up to the desired level.

Under the aforementioned circumstances, a thin film static induction transistor has been developed whose operation frequency can be accelerated up to a level of several MHz. Description may now be made with reference to FIG. 1 of the typical structure of the developed device. An n type amorphous silicon layer 2 acting as a drain electrode is deposited on insulative substrate 1 prepared from, for example, a glass plate. Provided on the layer 2 is intrinsic amorphous silicon layer 3 acting as an electron-travelling region. Shottky gate electrodes 4 are provided within the layer 3 at an equal distance. Further formed on the layer 3 are amorphous silicon layers 5 acting as source electrodes. The source electrodes 5 are so positioned as to face an intervening space between every two Shottky gate electrodes 4. In other words, electrodes 4 and amorphous silicon layers 5 are arranged in the staggered fashion in order to decrease capacitances between the respective gate electrodes 4 and source electrodes 5. Layer 3a is first formed to embed gate electrodes 4 in layer 3 as illustrated in FIG. 1. Gate electrodes 4 are formed on the layer 3a. Then layer 3b is further formed on the layer 3a.

The conventional SIT illustrated in FIG. 1 is accompanied with the undermentioned drawbacks. To begin with, electron traveling region 3 or channel region is prepared from intrinsic amorphous silicon, and has a high resistance of the order of $10^9$ Ωcm. Now let it be assumed that layer 3b acts as an electron injection region. Since, in FIG. 1, no care is taken with respect to the conductivity of the electron injection region. Region 3b, too, has as high a resistance as $10^9$ Ωcm. Consequently, drain current Ids flowing through an area defined between source and drain regions decreases due to the negative feed back action. Namely, the conventional device failed to fully increase drain current Ids. In the second place, an interface region is produced between layers 3a, 3b. Since the interface region deteriorates the control of drain current Ids by gate electrodes, the dynamic range of the drain current decreases. In the third place, the distance between the respective gate electrodes is of the order of 1-5 microns. However, tremendous difficulties are encountered in realizing the above-mentioned staggered arrangement by the present photo-etching technique with such an extremely high precision as less than 1 micron.

SUMMARY OF THE INVENTION

This invention has been accomplished in view of the above-mentioned circumstances, and is intended to provide a thin film static induction transistor capable of increasing drain current and facilitating manufacture, and also a method for manufacturing the same.

To attain the above-mentioned object, the present invention provides a thin film static induction transistor which comprises: an insulative substrate; a drain electrode involving a first semiconductor layer of first conductivity type which is deposited on the insulative substrate; a second semiconductor layer which is deposited on the first semiconductor layer for forming a charge traveling region and constructed by alternately arranging first regions bearing a first level top wall and second regions having a second level top wall lower than the first level top wall; source electrodes including third semiconductor layers of a first conductivity type formed on the first level top walls of the first regions; fourth semiconductor layers so formed as to cover the inner walls of recesses defined by the mutually facing exposed side walls of the third semiconductor, the mutually facing exposed side walls of the first regions and the exposed top wall of the second region; and gate electrodes mounted on the fourth semiconductor layer; wherein at least part of the second semiconductor layer is doped to first conductivity type; and the fourth semiconductor layers are selected from the group consisting of an intrinsic semiconductor layer and a semiconductor layer of first conductivity type doped to a lower concentration than the second semiconductor layer.

The method of manufacturing a thin film static induction transistor embodying the present invention comprises:

a first step involving the steps of depositing on an insulative substrate a first semiconductor layer of first conductivity type, mounting on the first semiconductor layer a second semiconductor layer involving at least one region doped to first conductivity type, and forming a third semiconductor layer doped to first conductivity type;

a second step involving the steps of forming resist patterns on the third semiconductor layer at the predetermined intervals, and selectively etching the third semiconductor layer and the second semiconductor layer with the resist patterns used as masks to form a plurality of recesses which are respectively defined by the mutually facing exposed etched side walls of the third semiconductor layer and the exposed etched walls of the second semiconductor layer; and a third step involving the steps of forming a fourth semiconductor layer covering the inner walls of the recesses and the exposed walls of the resist patterns, depositing a fifth layer to provide gate electrodes on the fourth semiconductor layer, and removing the resist patterns together with those portions of the fourth semiconductor layer which are deposited on the resist patterns and the fifth layer, thereby retaining only the fourth semiconductor layers deposited on the inner walls of the recesses and the fifth layers.

BRIEF DESCRIPTION OF THE DRAWINGS

FIG. 4 is a curve diagram showing the relationship between the gate-source voltage of the thin film static induction transistor of FIG. 2 and the drain current;

FIG. 5 is a sectional view of a thin film static induction transistor according to a second embodiment of the invention;

DETAILED DESCRIPTION OF THE PREFERRED EMBODIMENTS

Figure 2:
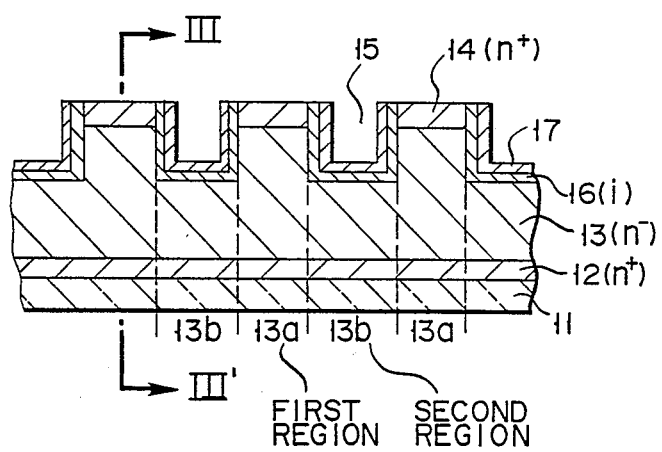
FIG. 2 is a sectional view of a thin film static induction transistor according to a first embodiment of the present invention.

Referring to FIG. 2, an amorphous silicon layer (first semiconductor layer) doped on n+ type is deposited on an insulative substrate 11 consisting of, for example, a glass plate. Amorphous silicon layer 13 (a second semiconductor layer) doped on n− type is deposited on layer 12 to act as an electron traveling region. The layer 13 comprises alternately arranged first and second regions. The first regions 13a has first level top wall and second region 13b has a second level top wall lower than the first level top wall. Deposited on the top wall of first regions 13a are amorphous silicon layers 14 (third semiconductor layer) doped to the n+ type to act as source electrodes. Recesses 15 are formed by the mutually facing side walls of layers 14, mutually facing side walls of first region 13a and the top wall of the second level of second regions 13b. Deposited on the inner wall of the recess 15 is nondoped amorphous silicon layer 16 (fourth semiconductor layer). Gate electrode 17 is formed on the silicon layer 16.

Lines 19, 20, 21 indicate the distribution on line III-—III' of FIG. 2 of the concentrations $N_B$ of the impurity in three different situations in third semiconductor layer 14, second semiconductor layer 13 and first semiconductor layer 12. Lines 19, 20, 21 likewise indicate that first and third semiconductor layers 12, 14 have a maximum impurity concentration. In contrast, the impurity concentration of second layer 13 retains the fixed level from the side of third layer 14 to the side of first layer 12 (line 21), or stepwise decreases (line 19) or slowly declines (line 20).

Fourth layer 16 may be an intrinsic semiconductor layer or an n type semiconductor layer doped to a lower level than the second semiconductor layer 13. Gate electrode 17 may be an electrode containing p type amorphous silicon or Shottky electrode containing Pt, Au or ITO ($In_xSn_yO$). Part or all of first, second, third and fourth layers may be prepared from amorphous silicon or polycrystalline silicon.

A thin film static induction transistor of FIG. 2 according to a first embodiment of the present invention indicates the undermentioned operation and effect. In the present invention, drain current Ids running between source electrode 14 and drain electrode 12 is controlled by voltage Vgs impressed across gate electrode 17 and source electrode 14. FIG. 4 indicates a static curve diagram representing the property of the transistor of FIG. 2. The abscissa shows voltage Vgs impressed across the gate and source, and the ordinate represents drain current Ids. Referring to FIG. 4, line 23 shows Ids characteristic when second layer 13 is doped to n− type. Line 24 represents Ids characteristic when second layer 13 is not doped. Line 25 indicates Ids characteristic when gate 17 and source electrode 14 are electrically insulated without providing layer 16. When second layer 13 was doped to n− type (line 23), drain current Ids was increased about 1000 times over the case where second layer 13 was not doped (line 24). Line 25 discloses that current Ioff (drain current which still flowed even when voltage −Vgs of the predetermined level was impressed) retained a high magnitude; insufficient contact characteristic appeared between second layer 13 and Shottky (gate) electrode 17; leak current between source electrode 14 and gate electrode 17 increased; and further an operation frequency of several MHz units was obtained. It was disclosed that since a highly resistive fourth layer 16 was intervened between gate electrode 17 and a group of second and third layers 13, 14, it was possible to decrease a leak current occurring between gate electrode 17 and source electrode 14.

Figure 1:
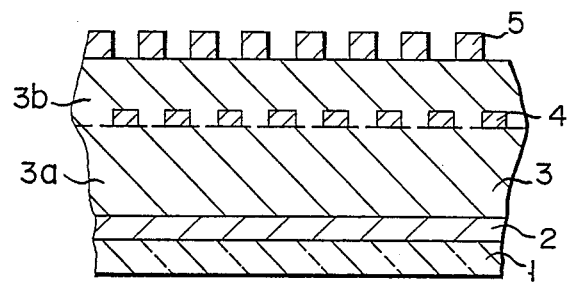
FIG. 1 is a sectional view of the conventional thin film static induction transistor.

A thin film static induction transistor embodying the present invention offers the undermentioned advantages over the conventional SIT device. Referring to FIG. 1 representing the conventional device, layer 3 is divided into layer 3a and layer 3b in order to effect the embedding of gate electrode 4 in the layer 3. To this end, a trap region is provided between layers 3a, 3b.

In contrast, the embodiment of the present invention (FIG. 2) is free from any such trap region, thereby avoiding the deterioration of the property of Ids, and consequently can be manufactured with great ease as described below. Referring to FIG. 5, metal electrode 27 is interposed between glass plate 11 and drain electrode 12. Metal electrode 28 is formed on source electrode 14. In this case, fourth layer 16 extends so as to cover the side walls of metal electrode 28. This structure can reduce sheet resistances of drain and source electrodes.

A thin film static induction transistor of FIG. 2 according to a first embodiment of the present invention is manufactured by the sequential steps shown in FIGS.

6A to 6C. To begin with, a first layer of n+ amorphous silicon layer 12 (acting as a drain electrode) is deposited on glass plate 11 by the plasma CVD process. The deposition is performed in an atmosphere of a gaseous mixture consisting of 99% of silane ($SiH_4$) and 1% of phosphine ($PH_3$), with the gas pressure set at 0.5-3 Torr, and the temperature ranged between 180° and 260° C. Next deposited on the first layer 12 is second layer 13 of n− amorphous silicon layer by the plasma CVD process in an atmosphere of a gaseous mixture consisting of silane ($SiH_4$) including 3-300 ppm of phosphine ($PH_3$). n+ amorphous layer 14a was deposited on the layer 13 by the same method as that applied in the making of layer 12 in order to fabricate a third layer of source electrode 14. The above-described steps are collectively referred to as a first process.

Figure 6A:
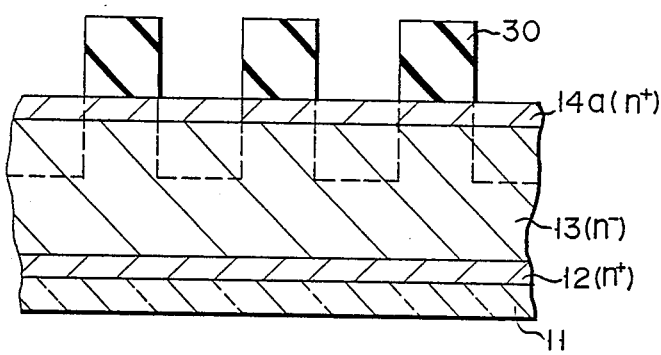
FIGS. 6A to 6C are sectional views indicating the sequential steps of manufacturing the thin film static induction transistor of FIG. 2.
Figure 6B:
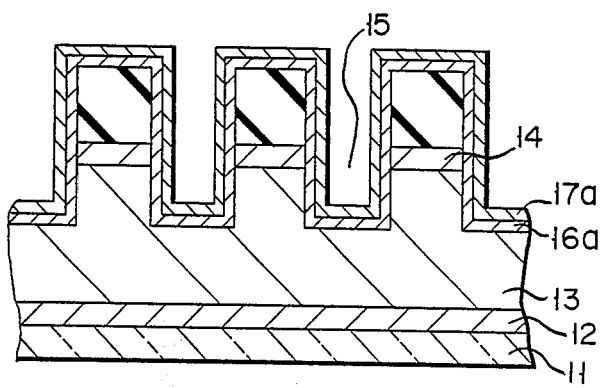

Thereafter, resist patterns 30 (prepared, for example, from photosensitive polyimide) are deposited on the layer 14a by the process of photolithography at the predetermined interval. Thereafter, those parts of layer 14a which are defined between every two resist patterns and those parts of second layer 13 which are surrounded by broken lines are etched off with the resist patterns 30 used as masks. This etching process is the dry type involving a gaseous mixture of $CF_4$ and $O_2$. As a result, third layers 14 acting as source electrodes are retained. Mutually facing etched side walls of the third layers 14 and surfaces of those etched portions of second layer 13 which are surrounded by broken lines constitute a plurality of recesses 15 (FIG. 6B). The aforementioned steps are collectively referred to as a second step.

Later, nondoped amorphous silicon layer 16a is formed by applying silane ($SiH_4$) gas to cover all the inner walls of the aforesaid plural recesses 15 and the exposed surfaces of the resist patterns. Disposed on the silicon layer 16a was ITO ($In_xSn_yO$) layer 17a by sputtering process (FIG. 6B). Later, layers 16a, 17a formed on the side and upper walls of resist patterns 30 as well as the resist patterns 30 themselves were etched off. As a result, layers 16a, 17a formed on the inner walls of the recesses 15 described with reference to FIG. 2 were respectively retained as fourth layer 16 and gate electrode 17. The above-mentioned steps are collectively referred to as a third step.

Figure 6C:
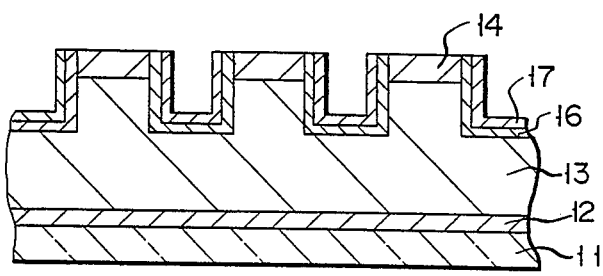

A thin film static induction transistor of FIG. 6C representing the present invention was manufactured.

Figure 3:
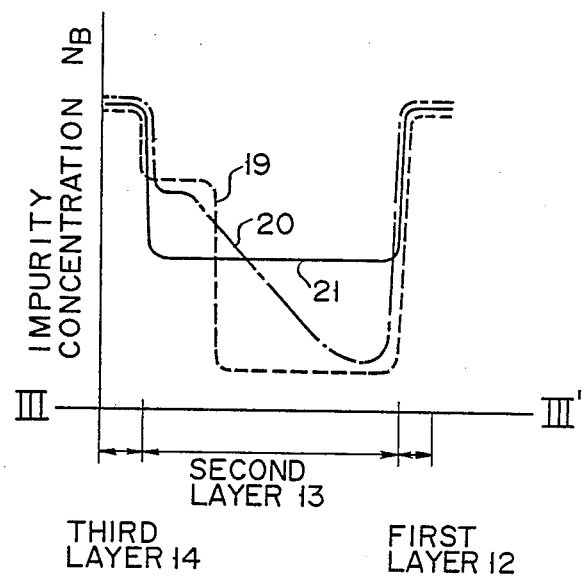
FIG. 3 sets forth the distribution of impurity concentrations along line III—III of FIG. 2.

If phosphine ($PH_3$) and silane ($SiH_4$) are mixed in a different ratio during the formation of the second semiconductor layer 13, then it is possible to obtain such distributions of impurity concentrations as are indicated by lines 19, 20 of FIG. 3. Further, it is possible to provide SIT retaining the structure of FIG. 6B without eliminating polyimide resist patterns 30 and operate a plurality of unit transistors in parallel.

Figure 7:
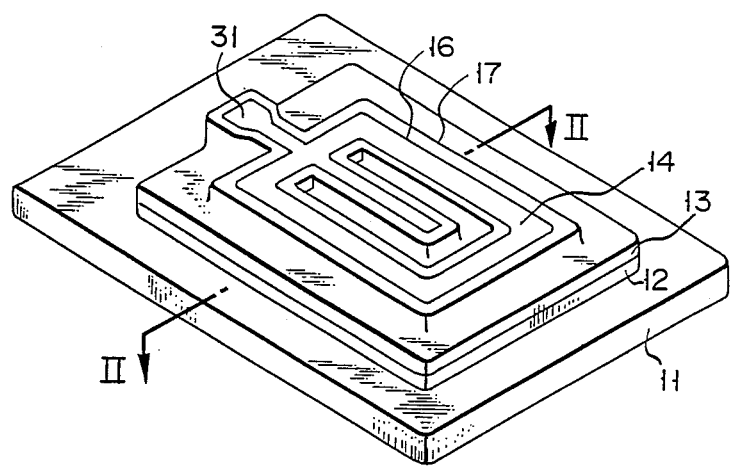
FIG. 7 is an oblique view of FIG. 2.

FIG. 7 is an oblique view of a thin film static induction transistor according to the first embodiment of the present invention. The sections on line II—II of FIG. 7 correspond to FIG. 2. Reference numeral 31 represents a pad used to take out source electrodes. The other numerals are the same as those of FIG. 2, description thereof being omitted.

Referring to FIG. 2, the influx of electrons from source electrode 14 to drain electrode 12 is controlled by regulating the potential of gate electrode 17. In this case, holes are carried from drain electrode 12 to source electrode 14, thereby decreasing the flow of drain current. To prevent the influx of the holes, it is advised to prepare first n+ layer 12 and third n+ layer 14 from n+ amorphous silicon carbide. This is because n+ amorphous silicon carbide has a large bond gap.

FIG. 2 indicates a thin film SIT device wherein the carriers mainly consist of electrons. If, however, the type of conductivity of the first to the third layers is reversed, it is possible to provide a thin film induction SIT device mainly intended for the flow of holes. Metal electrodes 27, 28 described in connection with FIG. 5 may be prepared from one selected from the group consisting of Ti, Al, Cr, Mo, and NiCr. If metal electrode 28 of FIG. 5 is prepared from opaque material, and gate electrode 17 is formed of, for example, transparent material of ITO ($In_xTi_yO$), then it is possible to manufacture a thin film static induction transistor of photo transistor type where current between the source and gate can be controlled by the potential of holes accumulated in fourth layer 16.

Figure 8:
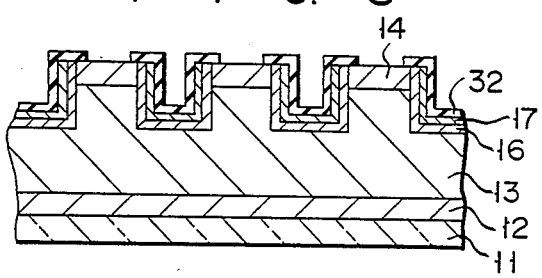
FIG. 8 is a sectional view of a first modification of the subject thin film static induction transistor.
Figure 9:
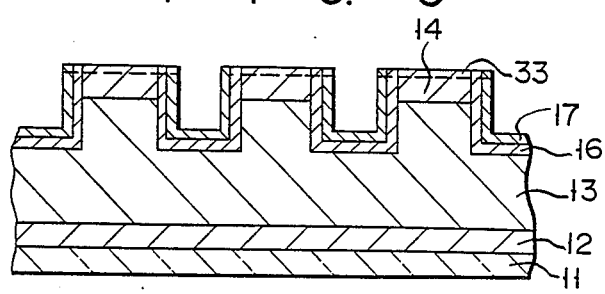
FIG. 9 is a sectional view of a second modification of the subject thin film static induction transistor.
Figure 10:
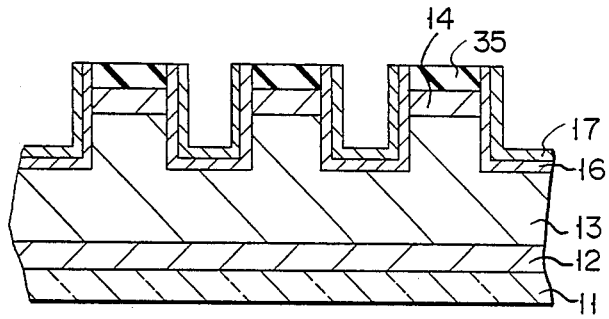
FIG. 10 is a sectional view of a third modification of the subject thin film static induction transistor.

The exposed surface region defined between source electrode 14 and gate electrode 17 shown in FIG. 2 tends to give rise to structural defects, which in turn result in the occurrence of surface leak current. The example of FIG. 8 is the type which is provided with means for suppressing the occurrence of the surface leak current. In this example, $SiO_x$ layer 32 covering an exposed region between source electrode 14 and fourth layer 16 and an exposed region between fourth layer 16 and gate electrode 17 is formed by the CVD process. Referring to FIG. 9, in the exposed end surface regions of the layer 16 and gates electrode 17 and in the exposed surface region of the source electrode is formed an oxide layer 33 by plasma treatment in an oxygen-containing atmosphere. The modification of FIG. 10 is constructed by forming insulating layer 35 on source electrode 14 and extending fourth layer 16 so as to cover the side walls of the insulating layer 35. The structure of FIG. 10 can be obtained by forming an insulating layer (not shown) on layer 14a of FIG. 6A and retaining layer 35 after etching the insulating layer.

Figure 11:
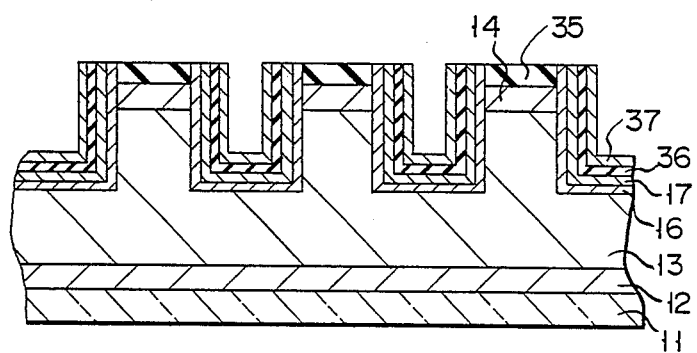
FIG. 11 is a sectional view of a fourth modification of the subject thin film static induction transistor.

The fourth modification of FIG. 11 is constructed by forming an insulating layer 36 ($SiO_x$ or $SiH_x$) on the gate electrode 17 of FIG. 10, and forming transparent conductive layer 37 acting as MOS type gate electrode on the insulating layer 36. The gate electrode 37 can be prepared by depositing the aforesaid ITO ($In_xTi_yO$) with a thickness of about 1000 Å. The deposition of transparent conductive layer 37 enables holes to be accumulated in the boundary between insulating layer 36 and gate electrode 17, thereby controlling the potential of gate electrode 17. Consequently it is possible to provide a photo-controlled MOS type thin film static induction transistor.

Figure 12:
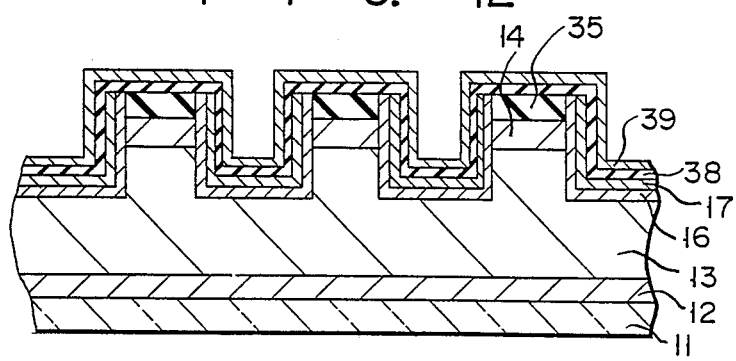
FIG. 12 is a sectional view of a fifth modification of the subject thin film static induction transistor.

The modification of FIG. 12 comprises insulating layer 38 formed by extending insulating layer 36 of FIG. 11 in order to cover the surface of insulating layer 35 and transparent conductive layer 39 covering the insulating layer 38. The modification of FIG. 12, too, is a photo-controlled MOS static induction transistor.

What is claimed is:
1. A thin film static induction transistor comprising:
an insulating substrate;
a first semiconductor layer of first conductivity type which is deposited on said insulating substrate and used as a drain region connected to a drain electrode;
a second semiconductor layer which comprises first regions each having a top surface of a first positional level and second regions each having a top surface of a second positional level lower than said first positional level and is used as a channel region, said first region having side surfaces corresponding to the difference between said first and second positional levels;

a third semiconductor layer of said first conductivity type which is formed on said top surface of said first region of said second semiconductor layer and used as a source region connected to a source electrode;

a fourth semiconductor layer provided on the inner surface of a recess which is defined by mutually facing side surfaces of adjacent two of said first regions, mutually facing side surfaces of said third semiconductor layer on said adjacent two of said first regions, and said top surface of said second region between said adjacent two of said first regions; and gate electrodes deposited on said fourth semiconductor layer; wherein said first to fourth semiconductor layers are made of amorphous silicon; said second semiconductor has the impurity concentration of said first conductivity type which indicates the highest level at the location which contacts said third semiconductor layer and stepwise decreases in the direction of the thickness of said second semiconductor layer; and said fourth semiconductor layer is made of one of intrinsic amorphous silicon and amorphous silicon of said first conductivity type doped to a concentration lower than that of said location of said second semiconductor layer contacting said third semiconductor layer.

2. The thin film static induction transistor according to claim 1, wherein said fourth semiconductor layer is made of amorphous silicon of said first conductivity type and said gate electrode is is made of a Schottky metal which forms Schottky potential barrier with respect to the majority carriers of said fourth semiconductor layer of said first conductivity type amorphous silicon.

3. The thin film static induction transistor according to claim 1, wherein said gate electrode is made of an amorphous silicon of second conductivity type.

4. The thin film static induction transistor according to claim 1, wherein metal layers used as electrodes are formed between said insulating substate and said first semiconductor layer and also on the top surface of said third semiconductor layer.

5. The thin film static induction transistor according to claim 1, which further comprises an insulating layer covering an end portion of said gate electrode, an end portion of said fourth semiconductor layer and that surface portion of said third semiconductor layer which contacts said fourth semiconductor layer.

6. The thin film static induction transistor according to claim 1, wherein a top surface of said third semiconductor layer and an end portion of the fourth semiconductor layer are oxidized to suppress the occurrence of leak current between said gate electrode and third semiconductor layer.

7. The thin film static induction transistor according to claim 1, wherein an insulating layer is deposited on said third semiconductor layer, and said fourth semiconductor layer is extended to contact a side surface of said insulating layer.

8. The thin film static induction transistor according to claim 7, wherein an insulating layer is formed on said gate electrode, and a transparent conductive layer is mounted on said insulating layer.

9. The thin film static induction transistor according to claim 7, wherein a second insulating layer covers said gate electrode and said insulating layer deposited on said third semiconductor layer; and a transparent conductive layer is deposited on said second insulating layer.

* * * * *